United States Patent
You et al.

[11] Patent Number: 6,066,574
[45] Date of Patent: May 23, 2000

[54] HOT PLATE CURE PROCESS FOR BCB LOW K INTERLEVEL DIELECTRIC

[75] Inventors: Lu You, Santa Clara; Dawn Hopper, San Jose; Christof Streck, Sunnyvale, all of Calif.

[73] Assignee: Advanced Micro Devices, Inc., Sunnyvale, Calif.

[21] Appl. No.: 09/187,429

[22] Filed: Nov. 6, 1998

[51] Int. Cl.⁷ .................................................. H01L 21/31
[52] U.S. Cl. ........................... 438/781; 438/780; 438/778
[58] Field of Search .................................. 438/781, 782, 438/780, 778

*Primary Examiner*—Olik Chaudhuri
*Assistant Examiner*—Ginette Peralta

[57] ABSTRACT

A dielectric layer comprising a benzocyclobutene (BCB)-based low dielectric constant (low k) material is formed on a surface of a semiconductor wafer substrate by (a) spin coating a layer of a fluid material comprising BCB in a liquid solvent or dispersant vehicle on the substrate; (b) baking the coated substrate at a first temperature and for a first time interval to remove the solvent; (c) curing the baked coating by heating at a second temperature higher than the first temperature, and for a second time interval; and (d) subjecting the substrate with cured coating thereon to a cool-down treatment at a third temperature and for a third time interval. Embodiments include performing steps (a)–(d) consecutively and in the same apparatus. Other embodiments include processing in an "on track" type automated semiconductor processing apparatus.

20 Claims, 2 Drawing Sheets

HOT PLATE CURE PROCESS FOR BCB LOW K INTERLEVEL DIELECTRIC

FIELD OF THE INVENTION

The present invention relates to forming low dielectric constant ("low k") layers suitable for use in semiconductor devices. The present invention has particular applicability to the formation of gap-fill and interlevel (ILD) dielectric layers in multilevel semiconductor devices.

BACKGROUND OF THE INVENTION

The escalating requirements for high density and performance associated with ultra-large scale integration semiconductor devices necessitate design features of 0.18 micron and under, increased transistor and circuit speeds, high reliability, and increased manufacturing throughput. The reduction of design features to 0.18 micron and under challenges the limitations of conventional interconnection technology, including conventional photolithographic, etching, and deposition techniques.

Conventional methodology for forming patterned metal layers comprises a subtractive etching or etch back step as the primary metal forming technique. Such a method involves the formation of a first dielectric layer on a semiconductor substrate, typically monocrystalline silicon (Si), with conductive contacts formed therein for electrical connection with at least one active region formed in or on the substrate, such as a source/drain region of a transistor. A metal layer is deposited on the first dielectric layer and patterned using photolithographic masking and etching techniques to form a desired conductive pattern comprising metal features separated by gaps, such as a plurality of metal lines with interwiring spacings therebetween. A dielectric layer is then applied to the resulting conductive pattern to fill in the gaps and the surface thereof is then planarized by conventional etching or chemical-mechanical polishing (CMP) techniques.

A through-hole is then formed in the dielectric layer to expose a selected portion of an underlying metal feature, the exposed portion of the metal feature at the bottom of the through-hole serving as a contact pad. Upon filling the through-hole with conductive material, such as a metal plug, to form a conductive via, the bottom surface of the conductive via is in electrical contact with the underlying metal feature.

Because many ultra large scale integration (ULSI) devices presently manufactured are very complex and require multiple levels of metallization for interconnections, it has been common to repeat the above-described via formation process multiple times, e.g., to form five levels of metallization interconnected by conductive vias, each level of metallization separated by at least one layer of dielectric material, termed an inter-level dielectric (ILD) layer.

A problem encountered in highly miniaturized semiconductor devices employing multiple metallization levels and reduced interwiring spacings in both the horizontal and vertical dimensions is related to the resistance-capacitance (RC) time constant of the system. Although semiconductor devices are presently being scaled in the horizontal dimension, they are not generally scaled in the vertical dimension, since scaling in both dimensions would lead to a higher current density that could exceed reliability limits. Horizontal scaling, however, requires conductive lines having a high aspect ratio, i.e., ratios of conductor height to conductor width greater than one, e.g., three or four, along with reduced interwiring spacings. As a consequence, capacitive coupling between conductive lines becomes a significant limitation on circuit speed. If intrametal capacitance is high, electrical inefficiencies and inaccuracies increase. It has been recognized that a reduction in capacitance within multi-level metallization system will reduce the RC time constant between the conductive lines.

The drive towards increased miniaturization and the resultant increase in the RC time constant have served as an impetus for the development of newer, low dielectric constant ("low k") materials as substitutes for conventional higher dielectric constant silicon oxide-based ILD materials. However, such dielectric materials must be able to serve a number of different purposes requiring diverse characteristics and attributes. For example, the ILD material must: prevent unwanted shorting of neighboring conductors or conducting levels by acting as a rigid, insulating spacer; prevent corrosion and/or oxidation of metal conductors, by acting as a barrier to moisture and mobile ions; fill deep, narrow gaps between closely spaced conductors; and undergo planarization of uneven surface topography so that a relatively flat level of conductors can be reliably deposited thereon. In addition, ILD films or layers must be formed at relatively low temperatures in order to avoid damage to or destruction of underlying conductors. Another, and important consideration in regard to RC time constant effects, is that such dielectric films used as ILD materials must have a low dielectric constant, as compared to the value of 3.9 of silicon dioxide ($SiO_2$), in order to reduce the RC time constant, lower power consumption, reduce crosstalk, and reduce signal delay in closely spaced conductors.

Benzocyclobutene (BCB), a class of organic materials and derivatives thereof, manufactured by Dow Chemical Co., Midland, Mich., offers many advantages for use in multilevel interconnect technology. For example, BCB materials are resistant to diffusion by metals, such as copper (Cu) and gold (Au). Therefore, BCB materials can serve as a barrier to diffusion of contact metals. In addition, BCB materials exhibit very low values of dielectric constant (k), i.e., about 2.4 to 2.7, as compared to 3.9 to 4.1 of $SiO_2$. Moreover, BCB materials can be applied by conventional spin-coating processing, resulting in good gap-filling and well planarized ILD layers.

However, a disadvantage associated with BCB-based dielectric materials applied by spin coating processes is the requirement for elevated temperature curing of the BCB-coated substrate in a separate oven or furnace. More specifically, conventional processing comprises applying a layer of BCB in fluid form (i.e., dissolved or dispersed in a solvent or dispersant liquid vehicle) to a substrate by spin coating, followed by baking at about 150° C. to remove the solvent or dispersant. After such removal, conventional practices require curing the coated substrate at 250° C. for 1 hour in a separate oven or furnace. Whereas the spin coating and solvent or dispersant removal steps can be performed in an automated fashion ("on track") by transport from a spin coating station to a "hot-plate" type baking station utilizing conventional track-type automated semiconductor processing apparatus, the removal of the baked wafers from the automated process track apparatus for curing treatment in a separate oven chamber for an extended time interval significantly reduces manufacturing throughput and, therefore, constitutes a significant drawback associated with the use of BCB-based ILD materials.

Thus, there exists a need for an "on track" process permitting utilization of BCB-based low k ILD materials in high-throughput automated, track-type semiconductor device manufacturing apparatus, particularly as employed in the manufacture of ultra large scale integration semiconductor devices having multiple metallization levels.

DISCLOSURE OF THE INVENTION

An advantage of the present invention is an improved process for applying BCB-based low k ILD layers by a spin coating process which does not require curing treatment in a separate oven for an extended time interval.

A further advantage of the present invention is a process for applying BCB-based low k ILD layers by spin coating which employs conventional "on-track" type processing apparatus.

A still further advantage of the present invention is a process for forming multilevel semiconductor devices employing BCB-based low k ILD layers, wherein the BCB-based low k ILD layers are provided by spin coating and curing of the coating in an "on-track" process.

Additional advantages, and other features of the present invention will be set forth in the description which follows and in part will become apparent to those having ordinary skill in the art upon examination of the following or may be learned from the practice of the present invention. The advantages may be realized and obtained as particularly pointed out in the appended claims.

According to the present invention, the foregoing and other advantages are achieved in part by a method of forming a layer of low dielectric constant material on a surface of a substrate, comprising the steps of:

(a) applying a layer of a fluid material comprising a benzocyclobutene (BCB), or a derivative thereof, and a liquid vehicle such as a solvent or dispersant therefor, to a substrate by a spin coating process, thereby forming a coated substrate;

(b) baking the coated substrate at a first temperature and for a first time interval sufficient to remove the solvent or dispersant from the coated material;

(c) curing the baked coating material by heating at a second temperature, higher than the first temperature, and for a second time interval sufficient to convert the baked coating material to a low dielectric constant ("low k") layer; and (d) subjecting the substrate with the low k layer thereon to a cool-down treatment at a third temperature, and for a third time interval;

wherein steps (a)–(d) are performed consecutively and in the same apparatus.

In an embodiment of the present invention, at least steps (b)–(d) are performed in an inert atmosphere, the first, second, and third temperatures are about 160° C., 325° C., and 60° C., respectively, and the first, second, and third time intervals are each about 60 sec.

In a further embodiment of the present invention, steps (a)–(d) are performed in a single track-type substrate transport apparatus comprising a spin coater station and three heating stations arranged in series.

In a still further embodiment of the present invention, the substrate comprises a single crystal Si semiconductor wafer having at least one active device region formed therein or thereon.

Additional advantages of the present invention will become readily apparent to those skilled in this art from the following detailed description, wherein only the preferred embodiments of the present invention are shown and described, simply by way of illustration but not limitation. As will be realized, the invention is capable of other and different embodiments, and its several details are capable of modification in various obvious respects, all without departing from the spirit of the present invention. Accordingly, the drawings and description are to be regarded as illustrative in nature, and not as restrictive.

BRIEF DESCRIPTION OF TEE DRAWINGS

The following detailed description of the embodiments of the invention can best be understood when read in conjunction with the following drawings, wherein.

DESCRIPTION OF THE INVENTION

Figure 1:
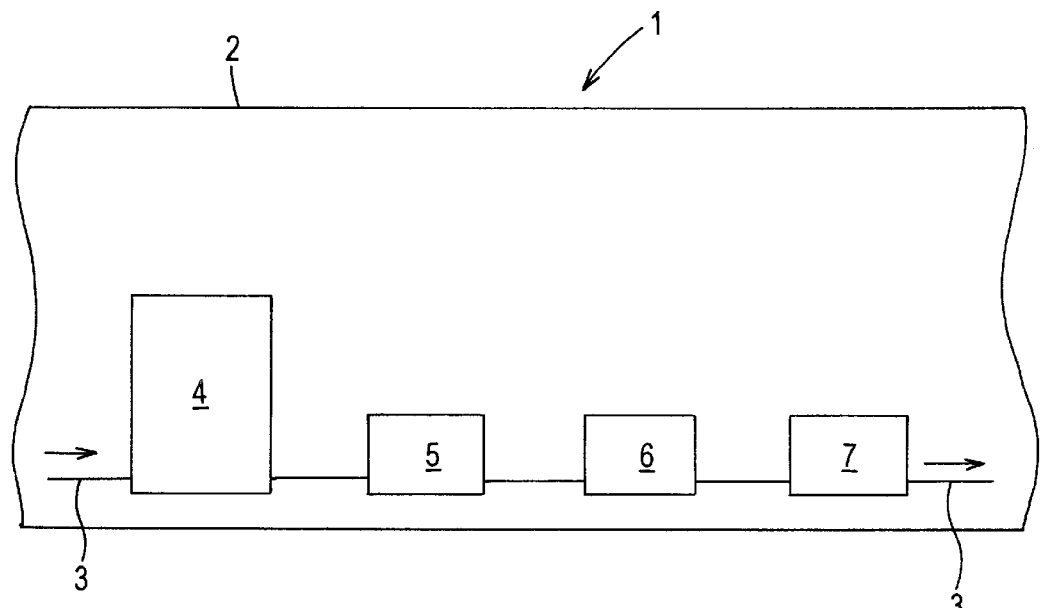
FIG. 1 is a simplified schematic, cross-sectional view of a portion of a track-type ("on-track") automated apparatus suitable for use in embodiments of the invention.

Referring now to FIG. 1, schematically shown therein is a cross-sectional view of a portion 1 of an automated "on-track" type apparatus suitable for use in the practice of embodiments of the present invention. On-track automated semiconductor manufacturing apparatuses of the type contemplated herein may, for example, be obtained from the Tokyo Electron Co. (Tokyo, Japan) under the designation TEL Track Mark 8™. However, it should be recognized that the practice of the present invention is not dependent upon the use of any particular apparatus, which fact will become apparent from the present disclosure.

As illustrated, apparatus portion 1 comprises an enclosure 2, a workpiece transfer mechanism 3, termed a "track", for transporting workpiece substrates such as semiconductor wafers (not shown) past a plurality of serially arranged stations where the wafers are subjected to various treatments, processes, etc., such as are commonly performed in semiconductor device manufacture. Apparatus portion 1 comprises, from left to right in the direction of substrate transport, a spin coater station 4 and three heating, or "hot plate", stations 5, 6, and 7 arranged in series fashion. As shown at the left side of FIG. 1, track 3 supplies wafer substrates from an upstream portion of the apparatus, comprising stations (not shown for illustrative simplicity) for performing antecedent wafer processing, to spin coater station 4, wherein a coating layer of ILD containing material, a BCB material or derivative thereof in the instant case, is applied to the surface of the wafer. After completion of the spin coating step, the wafer substrates exit the spin coater station 4 and are transported, by means of transfer mechanism 3, into and out of hot plate stations 5, 6, and 7 for conversion of the spin-coated BCB material into a low dielectric constant (low k) ILD material, according to the inventive process. As may be apparent, the process according to the present invention is fully "on-track", i.e., performed in an automated track type semiconductor processing apparatus, and does not require removal of the spin-coated wafers from the apparatus for treatment in a separate chamber type oven or furnace.

Figure 2:
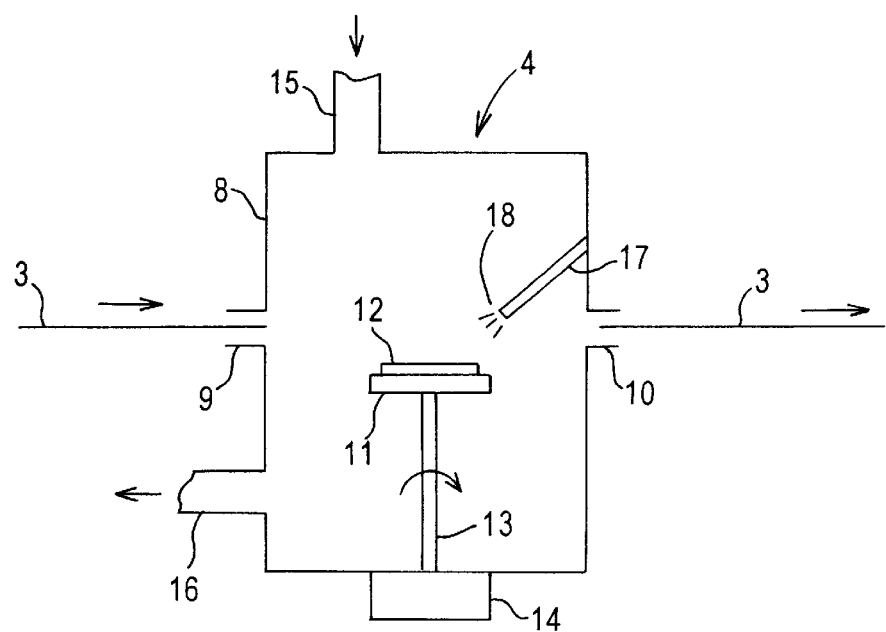
FIG. 2 is a simplified schematic, cross-sectional view of a spin-coater station suitable for use in the apparatus of FIG. 1.

Referring now to FIG. 2, shown therein is an illustrative, but non-limitative, example of a spin coating station 4 suitable for use in track type apparatus portion 1. In the illustrated embodiment, spin coating station 4 comprises a coating chamber 8 having entrance and exit apertures 9 and 10, respectively, at opposite sides thereof for receiving and discharging substrates 12 supplied thereto and removed therefrom by track type transfer mechanism 3. Coating chamber 8 includes support 11 for mounting thereon a substrate 12, typically a semiconductor wafer comprising an integrated circuit. The support 11 is mounted on a rotatable shaft 13 which is coupled to a motor 14 for spinning the support 11. The chamber 8 may also be provided with a gas inlet 15 and gas outlet 16, for respectively supplying a desired gas atmosphere, e.g., an inert gas such as nitrogen ($N_2$), and exhausting the chamber 8 to achieve a desired vacuum level or low $O_2$ level. Dispenser 17 is provided at an adjustable distance above the height of the support 11 for supplying a predetermined amount of a fluid containing the coating material 17 (a BCB material or derivative of) on the exposed upper surface of the wafer substrate 12. A means (not shown) for regulating the pressure of the applied coating fluid is typically provided to control the deposited film properties, e.g., the presence and number of "microbubbles".

A typical operational sequence ("recipe") employing the illustrated or similar type spin coating apparatus. One such recipe for applying spin-on coatings such as dielectric gap fill and ILD layers to semiconductor wafers including integrated circuitry formed therein or thereon, comprises several stages. In the first stage, a predetermined amount of the coating material is dispensed over a predetermined time interval while spinning the wafer at a low speed, e.g., about 300 rpm. In the second stage, following completion of dispensing, the spin rate is rapidly accelerated ("ramped up") over a short time interval to reach a preselected, substantially higher rotational speed, e.g., about 2,500–3,000 rpm, sufficient to uniformly spread, by centrifugal force, the dispensed coating material over at least a desired portion of the semiconductor wafer substrate. In the third stage, the spin rate is maintained at the preselected high rotational speed for a preselected time interval to ensure proper spreading of the dispensed coating material and to reach a desired film thickness. In a final stage, the spin rate is reduced to a lower rate over a preselected time interval and the coated wafer is removed from the coating chamber for further processing to obtain the desired coating properties, e.g., dielectric constant, by baking at a first temperature for a first time interval to effect solvent or dispersant removal, curing at a second temperature for a second time interval, and "cooling down" at a third temperature for a third time interval.

As was previously indicated, in conventional spin-coating processing utilizing a BCB material or derivative thereof for forming low dielectric constant (low k) ILD layers, the above-mentioned curing step was required to be performed "off track" in a separate box-type oven or furnace at temperatures on the order of about 250° C. for a substantial period of time, i.e., about 1 hour. Such "off-track" processing considerably reduces process throughput and is disadvantageously lengthy. Applicants, on the other hand, have discovered that a satisfactory post-spin coating process sequence which results in good quality BCB-based, low k, ILD layers in multilevel semiconductor devices can be performed without requiring the use of a separate box-type oven or furnace, by providing a series of three, substantially similarly constituted hot-plate type heating stations positioned downstream of the spin coating station of a track type automated semiconductor processing apparatus. Solvent or dispersant removal is effected at the first hot plate station 5, curing at second hot plate station 6, and cool-down at hot plate station 7, as will be described in farther detail below.

Figure 3:
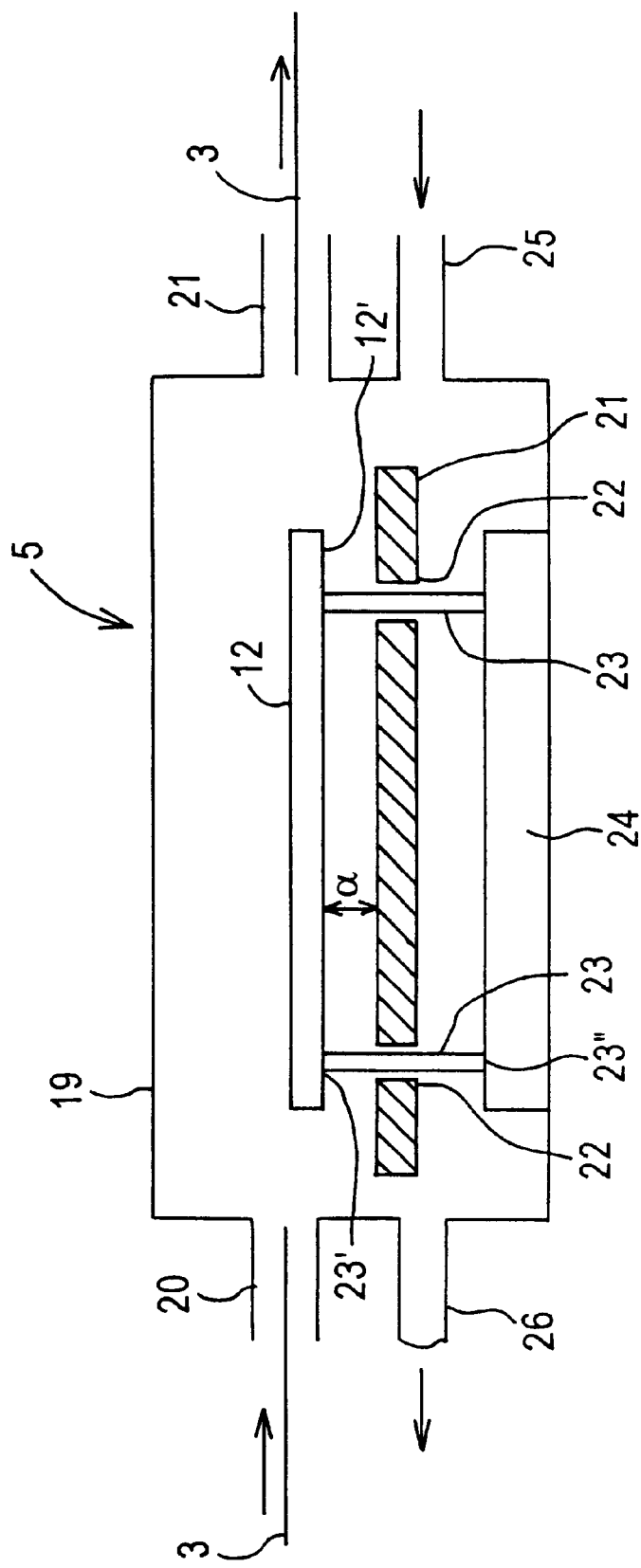
FIG. 3 is a simplified schematic, cross-sectional view of one of three substantially similar hot plate stations of the apparatus of FIG. 1.

Referring now to FIG. 3, shown therein is a simplified, cross-sectional view of an illustrative, but non-limitative example, of the constitution of one of the three substantially similar hot plate stations 5, 6, and 7 illustrated in FIG. 1, e.g., station 5. In the illustrated embodiment, hot plate station 5 comprises an enclosure or chamber 19 having entrance and exit apertures 20 and 21, respectively, at opposite sides thereof for receiving and discharging wafer substrates 12 supplied thereto and removed therefrom by track type transfer mechanism 3. Hot plate station 5 further includes a hot plate heating element 21 (including means, not shown, for controllably regulating and maintaining the temperature of same) having a plurality of through-holes 22 accomodating a corresponding plurality of wafer lifting pins 23 extending therethrough and contacting the lower surface 12' of wafer 12 at the upper ends 23' thereof. The lower ends 23" of the lifting pins 23 are operably connected to lifting means 24, capable of controlling the rates of raising and lowering of the wafer substrate 12 in relation to the hot plate heating element 21. Controllable ramping up and ramping down of the temperature experienced by the wafer substrate 12 is obtained by regulation of the spacing "d" between the hot plate heating element 21 and the wafer substrate 12 as well as the length of time spent at each spacing "d", by controlling the rates of raising and lowering of the wafer substrate 12. Such ramping up and ramping down of wafer substrate temperatures advantageously minimizes deleterious effects due to thermal shocking which the wafer may experience as a result of excessively rapid temperature changes upon transfer from one heating station at one temperature to another station at a substantially different temperature. And more importantly, the rampings prevent the oxidation of BCB, since inert gas, $N_2$ e.g., purging also takes a similar time. Finally, the enclosure or chamber 19 may be provided with a gas inlet 25 and gas outlet 26, for respectively supplying a desired gas atmosphere, e.g., an inert gas such as nitrogen ($N_2$), for preventing oxidation of the BCB ILD material and the wafer during the elevated temperatures achieved during processing therein, and for exhausting the chamber 19 for achieving a desired vacuum level.

Referring now to FIGS. 1–3, in a typical method according to the invention, a semiconductor 12 wafer, e.g., of monocrystalline Si having integrated circuitry formed therein or thereon, is subjected to antecedent processing in an "on-track" type apparatus and transferred via track mechanism 3 to portion 1 of the apparatus comprising spin coater station 4 for application of a BCB based coating to the surface thereof according to a recipe such as described above, and then transported via track mechanism 3, through hot plate stations 5, 6, and 7, in sequence, for solvent or dispersant removal, curing, and cool-down. Upon exiting hot plate station 7, wafer 12 is transferred via track mechanism 3 to additional stations (not shown) for further processing.

More specifically, according to a typical process performed according to the invention, a fluid material 18 comprising a BCB material or a derivative thereof in a solvent or dispersant therefor (e.g., Cyclotene™, available from Dow Chemical Co., Midland, Mich.) having a viscosity of from about 5 cP to about 15 cP is supplied to dispenser 17 of spin coater station 4 at a dispense pressure of about 0.20 kgf/cm² to about 0.5 kgf/cm² for a dispense interval of about 1 sec. to about 10 sec., with a spacing between the tip of dispensing means 17 and wafer 12 surface of from about 1 mm to about 2 mm. The wafer spin rate is about 300 rpm during the dispense interval and from about 2,500 rpm to about 3,500 rpm for uniform spreading of the coating over the surface of the wafer.

Baking of the thus-applied BCB coating in first heating station 5 to effect removal of the solvent or dispersant therefrom is performed at a temperature of from about 140° C. to about 180° C., typically about 160° C., for about 30 sec. to about 90 sec., typically 60 sec. Curing of the thus-baked BCB coating in second heating station 6 is then performed at a temperature of about 250° C. to about 350° C., typically about 325° C., for about 30 sec. to about 90 sec., typically about 60 sec. Finally, cool-down of the thus-cured coating is performed in third heating station 7 at a temperature of about 20° C. to about 120° C., typically about 60° C., for about 30 sec. to about 90 sec., typically 60 sec. It is to be noted that each of the abovementioned time intervals includes ramping up time and ramping down time for minimizing deleterious effects due to thermal shock and BCB oxidation, etc.

BCB derived low k ILD layers or coatings produced by the foregoing process according to the present invention typically exhibit a film thickness of about 3,000 to about 10,000 Å, film index of about 1.57, film uniformity within about ±1%, tensile stress less than about 30 MPa, and dielectric constant of about 2.6.

It is therefore apparent that the inventive process represents a significant improvement over conventional processes using BCB-based low k ILD layers, whereby low k ILD layers having excellent properties are obtained with the use of an "on-track" processing apparatus in very substantially shortened process times (i.e. about 4 min. vs. about 64 min.), thereby achieving considerable process simplification and increased manufacturing throughput.

EXAMPLE

Cyclotene 5021-32 (Dow Chemical Co., Midland, Mich.) was spin coated onto a Si wafer at a dispense pressure of about 0.25–0.4 kgf/cm$^2$ (higher dispense pressures were observed to result in formation of microbubbles of sizes <1 um in the films) and the dispenser was positioned very close (1–2 mm) to the wafer surface to avoid droplet formation. The spin rate during dispensing was about 300 rpm, and about 2,500 rpm during the main spin for spreading of the applied material. The temperatures of the three hot plates were respectively 160° C., 300° C., and 120° C., with 60 sec. intervals for each, including ramp up and ramp down. An N$_2$ gas ambient was employed during heating to minimize oxidation, as BCB is very sensitive to oxidation, particularly during the cure step at 300° C. No significant handling or compatibility problems with conventional on-track processing apparatus were observed. The following data were obtained for films derived from Cyclotene 5021-32.

BCB-based spin-on coatings utilized in all manner of applications requiring a dielectric layer.

Only a preferred embodiment of the present invention and an example of its utility have been illustrated above. It is understood that the invention is susceptible of changes or modifications within the scope of the inventive concept as expressed herein.

What is claimed is:

1. A method of forming a layer of low dielectric constant material on a surface of a substrate, the method comprising the steps of:
    (a) applying a layer of a fluid coating material comprising a benzocyclobutene (BCB) or a derivative thereof and a solvent or dispersant therefor to a substrate by a spin coating process, thereby forming a coated substrate;
    (b) baking the coated substrate at a first temperature and for a first time interval sufficient to remove said solvent or dispersant from the coating material;
    (c) curing the baked coating material layer by heating at a second temperature, higher than said first temperature, and for a second time interval sufficient to convert the baked coating material layer to a low dielectric constant ("low k") coating layer; and
    (d) subjecting said substrate with said low k coating layer thereon to a cool-down treatment at a third temperature, lower than said second temperature, and for a third time interval;
    wherein said steps (a)–(d) are performed consecutively and in the same apparatus.

2. The method according to claim 1, comprising performing at least steps (b)–(d) in an inert atmosphere.

3. The method according to claim 2, wherein said inert atmosphere comprises nitrogen (N$_2$).

4. The method according to claim 1, wherein said first temperature is from about 140° C. to about 180° C. and said first time interval is from about 30 sec. to about 90 sec.

5. The method according to claim 4, wherein said first temperature is about 160° C. and said first time interval is about 60 sec.

6. The method according to claim 1, wherein said second temperature is from about 250° C. to about 350° C. and said second time interval is from about 30 sec. to about 90 sec.

7. The method according to claim 6, wherein said second temperature is about 325° C. and said second time interval is about 60 sec.

8. The method according to claim 1, wherein said third temperature is from about 20° C. to about 120° C. and said third time interval is from about 30 sec. to about 90 sec.

9. The method according to claim 8, wherein said third temperature is about 60° C. and said third time interval is about 60 sec.

TABLE 1

| Wfr ID | Spin (rpm) | Cure (°C.) | Particles | Index | Thickness (Å) | Uniformity (Å) | Stress (MPa) |
|---|---|---|---|---|---|---|---|
| 95 . . . A1 | 3000 | 300 | ~5000 | 1.5794 | 8937 | 58 | |
| 95 . . . A3 | 2500 | 300 | 465 | 1.5720 | 10546 | 96 | |
| 95 . . . B7 | 2500 | 300 | 310 | 1.5718 | 10401 | 90 | 29 |
| 95 . . . F6 | 2500 | No cure | 157 | 1.5879 | 13303 | 35 | |
| 95 . . . D7 | 2500 | 300 | 107 | 1.5728 | 10615 | 99 | 22 |

The present invention enjoys particular applicability in manufacturing multilevel semiconductor devices, notably in depositing BCB-based low k dielectric gap fill and ILD layers. However, the present invention is applicable to 10. The method according to claim 1, comprising performing steps (a)–(d) in a single, on-track type apparatus comprising a spin coater station and three heating stations arranged in series, and including track means for transporting said substrate from station to station.

11. The method according to claim 10, wherein each of said heating stations includes hot plate means and lowering and raising means for controllably lowering and raising said substrate into and out of contact with said hot plate means, thereby providing controllable ramp up times and ramp down times of said first, second, and third temperatures.

12. The method according to claim 11, wherein said first, second, and third time intervals include respective time intervals for said ramp times up and ramp down times of said first, second, and third temperatures.

13. The method according to claim 12, wherein step (a) comprises:

providing said fluid material comprising a BCB or a derivative thereof and a solvent or dispersant therefor in a dispensing means of said spin coater station;

providing said spin coater station with said substrate having a surface to be coated;

applying a selected amount of said fluid material from said dispensing means to a central portion of said substrate surface while rotating the substrate about a central axis perpendicular to said surface at a first, relatively slow speed; and rotating the fluid material-coated substrate at a second, relatively high speed and for a time interval sufficient to uniformly spread the fluid material over at least a portion of the substrate surface.

14. The method according to claim 13, wherein the fluid material comprising a BCB or a derivative thereof and a solvent or dispersant therefor has a viscosity of from about 5 cP to about 15 cP and is applied to said substrate surface at a dispense pressure of from about 0.20 kgf/cm$^2$ to about 0.5 kgf/cm$^2$ for a dispense time interval of from about 1 sec. to about 10 sec, and the dispensing means is positioned at a distance of from about 1 mm to about 2 mm from the substrate surface.

15. The method according to claim 14, wherein the dispense pressure is about 0.25 kgf/cm$^2$, the dispense time interval is about 5 sec., the first, relatively rotational speed is about 300 rpm, the second, relatively high rotational speed is from about 2,500 rpm to about 3,000 rpm, and the cured low k coating layer has a film thickness of about 10,000 Å, film index of about 1.57, film uniformity within about ±1%, tensile stress less than about 30 Mpa, and a dielectric constant (k) of about 2.6.

16. The method according to claim 15, wherein the substrate comprises a semiconductor.

17. The method according to claim 16, wherein the semiconductor is silicon.

18. The method according to claim 16, wherein the semiconductor comprises a single crystal silicon wafer having at least one active device region formed therein or thereon.

19. The method according to claim 18, wherein the silicon wafer comprises a multilevel integrated semiconductor device.

20. A coated silicon wafer made according to the process of claim 19.

* * * * *